(12) United States Patent
Dausch et al.

(10) Patent No.: US 6,359,374 B1
(45) Date of Patent: Mar. 19, 2002

(54) MINIATURE ELECTRICAL RELAYS USING A PIEZOELECTRIC THIN FILM AS AN ACTUATING ELEMENT

(75) Inventors: David E. Dausch, Raleigh; Gary E. McGuire, Chapel Hill, both of NC (US)

(73) Assignee: MCNC, Research Triangle Park, NC (US)

( * ) Notice: Subject to any disclaimer, the term of this patent is extended or adjusted under 35 U.S.C. 154(b) by 0 days.

(21) Appl. No.: 09/448,080

(22) Filed: Nov. 23, 1999

(51) Int. Cl.[7] .............................................. H01L 41/08
(52) U.S. Cl. ...................... 310/330; 310/332
(58) Field of Search ......................... 310/328, 330–332

(56) References Cited

U.S. PATENT DOCUMENTS

| | | |
|---|---|---|
| 2,851,618 A | 9/1958 | Krawinkel |
| 3,772,537 A | 11/1973 | Clifford et al. |
| 4,383,195 A * | 5/1983 | Kolm et al. ................. 310/330 |
| 4,403,166 A | 9/1983 | Tanaka et al. |
| 4,473,859 A | 9/1984 | Stone et al. |
| 4,553,061 A | 11/1985 | Germano |
| 4,581,624 A | 4/1986 | O'Connor |
| 4,595,855 A | 6/1986 | Farrall |
| 4,620,123 A | 10/1986 | Farrall et al. |
| 4,620,124 A | 10/1986 | Farrall et al. |
| 4,622,484 A | 11/1986 | Okihara et al. |
| 4,626,698 A | 12/1986 | Harnden, Jr. et al. |
| 4,658,154 A | 4/1987 | Harnden, Jr. et al. |
| 4,755,706 A * | 7/1988 | Harnden, Jr. et al. ....... 310/332 |
| 4,811,246 A | 3/1989 | Fitzgerald, Jr. et al. |
| 4,819,126 A | 4/1989 | Kornrumpf et al. |
| 4,826,131 A | 5/1989 | Mikkor |
| 4,857,757 A | 8/1989 | Sato et al. |
| 4,907,123 A * | 3/1990 | Taniguchi et al. ....... 310/330 X |
| 4,916,349 A | 4/1990 | Kornrumpf |
| RE33,568 E | 4/1991 | Harnden, Jr. et al. |
| RE33,577 E | 4/1991 | Harnden, Jr. et al. |
| RE33,587 E | 5/1991 | Harnden, Jr. et al. |
| RE33,618 E | 6/1991 | Harnden, Jr. et al. |
| RE33,691 E | 9/1991 | Harnden, Jr. et al. |
| 5,065,978 A | 11/1991 | Albarda et al. |
| 5,138,216 A * | 8/1992 | Woodruff et al. ....... 310/330 X |
| 5,162,691 A | 11/1992 | Mariani et al. |
| 5,243,861 A | 9/1993 | Kloeck et al. |
| 5,278,368 A | 1/1994 | Kasano et al. |
| 5,286,199 A * | 2/1994 | Kipke ..................... 310/328 X |
| 5,479,042 A | 12/1995 | James et al. |
| 5,499,541 A | 3/1996 | Hopf et al. |
| 5,544,001 A | 8/1996 | Ichiya et al. |
| 5,594,292 A | 1/1997 | Takeuchi et al. |
| 5,619,061 A | 4/1997 | Goldsmith et al. |
| 5,620,933 A | 4/1997 | James et al. |
| 5,627,396 A | 5/1997 | James et al. |
| 5,638,946 A | 6/1997 | Zavracky |
| 5,659,195 A | 8/1997 | Kaiser et al. |
| 5,666,258 A | 9/1997 | Gevatter et al. |
| 5,677,823 A | 10/1997 | Smith |
| 5,723,894 A | 3/1998 | Ueno et al. |
| 5,726,480 A | 3/1998 | Pister |
| 5,796,152 A | 8/1998 | Carr et al. |

* cited by examiner

*Primary Examiner*—Mark O. Budd
(74) *Attorney, Agent, or Firm*—Alston & Bird LLP

(57) ABSTRACT

A miniature electrical relay including a piezoelectric actuating element where the piezoelectric actuating element includes a piezoelectric thin-film material sandwiched in between two metal electrode layers that function as piezoelectric electrodes. The metal electrode layers are connected to a positive and negative terminal, respectively, of a power source, which results in actuation of the piezoelectric actuating element. The piezoelectric actuating element is affixed to a deformable metal contact through an insulating layer, such that when actuated, the piezoelectric actuating element selectively deforms the deformable metal contact to cause the contact to move into or out of electrical and mechanical connection with a fixed metal contact. A method of making the miniature piezoelectric includes providing a support structure, depositing a first contact on a first portion of the support structure, depositing a second contact on a second portion of the support structure, wherein the second contact is deformable with respect to the first contact for selectively engaging the first contact, and fabricating a piezoelectric actuator that selectively deforms the second contact relative to the first contact.

7 Claims, 2 Drawing Sheets

MINIATURE ELECTRICAL RELAYS USING A PIEZOELECTRIC THIN FILM AS AN ACTUATING ELEMENT

FIELD OF THE INVENTION

The present invention generally relates to electrical relays. More specifically, the present invention relates to such relays having a piezoelectric film.

BACKGROUND OF THE INVENTION

Relays are used to switch a wide range of electrical circuits by using solid state or mechanical switches that permit and prevent electrical components from receiving power supply. Relays may perform satisfactorily in some applications, but often suffer some unfavorable performance characteristics, such as being unreliable, slow, large, costly, and/or power consuming. These unfavorable performance characteristics produce unreliable circuits and prevent the use of one specific relay in many different applications.

It is recognized that a relay may perform satisfactorily in a variety of circuits, applications and environments if certain beneficial features are achieved. Many of these features include high power load capability, low power switch actuation, minimization of arcing, cheap and simple fabrication, and small size. For example, relays with high current-carrying capability are needed for circuits in various satellite and cellular communications equipment. Furthermore, smaller, lower power relays are desirable for the ever shrinking size of circuitry in consumer electronics and other commercial and non-commercial applications. Although a variety of conventional relay designs attempt to achieve these and other beneficial attributes, conventional relays still suffer some undesirable characteristics.

For example, solid-state switches based upon semiconductor technology such as GaAs field effect transistors (FETs) may be utilized to construct an electrical relay. Such a relay is small in dimension and provides fast switching at low operating voltages. However, a solid-state relay can only switch circuits carrying small currents (e.g., in the micro-amp to milliamp range). Furthermore, due to the semiconductor nature of these FET devices (i.e., the p-n junctions), a solid-state relay generally possesses high on-resistance, which generally means that the impedance of power flow through the relay is relatively high.

Relay devices based on mechanical actuators are also known, including those driven by electrostatic, magnetic, thermal, hybrid, and bulk piezoelectric actuators. Because these switches are operated by mechanically connecting and disconnecting two metal contacts, mechanical relays often benefit from lower on-resistance than solid-state relays.

Electrostatic relays are actuated by applying an electrostatic field between two electrodes to move a thin, flexible film. These relays can be micromachined to very small sizes, and can produce relatively sizable displacements at relatively high frequencies to ensure an open circuit in an off condition. However, due to thin metal electrode layers that are generally used for the metal contacts, the current carried over the contacts is limited to the milliamp range. Furthermore, high voltage is typically required for electrostatic relay operation (e.g., 50–100 volts). Magnetic relays, like electrostatic relays, also provide large displacements between the metal contacts. Unlike electrostatic relays, however, magnetic relays can carry relatively large currents (milliamp to amp range) over the electrical contacts, and can produce very strong contact force between the circuit contact elements. Nonetheless, magnetic relays generally suffer from a number of disadvantages, including magnetic operation, short lifetime and large size. Thermal buckling relays also provide high force actuation and large displacement, but typically require high power consumption. Moreover, switching speeds are often slow in these actuators, and the thermal power required to drive thermal actuators of these thermal buckling relays can cause deleterious effects on circuit performance.

A hybrid drive relay is another type of mechanical relay, utilizing a combination of actuating devices. Conventional hybrid drive relays include hybrid thermal/electrostatic and piezoelectric/electrostatic actuators that combine the attributes of higher force actuation (e.g., thermal or piezoelectric) with higher displacement actuation (e.g., electrostatic actuation). The thermal/electrostatic drive, however, still requires thermal power for actuation which can cause deleterious effects on circuit performance. The piezoelectric/electrostatic drive uses the natural expansion and/or contraction of a piezoelectric material under an applied electric field in combination with an electrostatic drive to actuate one or more contact elements.

One such hybrid piezoelectric/electrostatic relay is described in U.S. Pat. No. 5,666,258, to Gevatter et al. Gevatter et al. discloses a hybrid micromechanical relay including both a piezoelectric actuator and an electrostatic actuator, where the two actuators operate in tandem to supply a relatively strong contact force between contact elements. The hybrid piezoelectric/electrostatic relay, however, utilizes the piezoelectric element merely to assist the electrostatic actuation by providing higher force. The thickness and geometry of the piezoelectric layer is not optimized such that the piezoelectric is the primary driver. Furthermore, this hybrid drive requires multiple processing steps on separate wafers for each driver element and also requires wafer bonding for final assembly. This method complicates device fabrication compared with monolithic micromachined structures.

Piezoelectric materials also may be exclusively utilized as actuating means in bulk piezoelectric relays, another type of mechanical relay. An example of a bulk piezoelectric relay is described in U.S. Pat. No. 4,595,855, to Farrall. Farrall discloses a piezoelectric relay formed by adhesive bonding assembly steps using a ceramic piezoelectric material. Like other types of mechanical relays, a piezoelectric bulk ceramic relay suffers from some weaknesses. The bulk ceramic relay is relatively large in dimension, and would likely be used as a discrete component added separately to a circuit to be switched, or machined into a bimorph or array structure. The relay can also require high operating voltages for actuation, in the range of several hundred volts.

Generally, therefore, an unsatisfied need exists in the industry for a low cost and easily fabricated relay with a high force output that allows for thick metal contacts for switching of high currents, fast switching speeds, long lifetime and relatively low operating voltages.

SUMMARY OF THE INVENTION

These and other advantages are provided, according to the present invention, by providing a miniature electrical relay having a thin film piezoelectric actuating element as the primary driver. A miniature electrical relay in accordance with the present invention can take numerous forms to provide desired results. For example, the present invention can be embodied in the form of a cantilever relay or a bridge relay. Such miniature relay advantages include cheap and simple fabrication, low operating power, high force output, high current switching capability, and integration with small circuits.

In accordance with the present invention, a piezoelectric actuating element is deposited on a movable contact of a miniature relay. The piezoelectric actuating element includes a piezoelectric material, preferably a piezoelectric film with a thickness in the range of 1–10 μm, sandwiched in between two metal electrode layers that function as piezoelectric electrodes. The piezoelectric actuating element can be actuated by applying an electric field across the metal electrode layers, such as by selectively connecting the metal electrode layers to a positive terminal and a negative terminal, respectively, of one or more power sources. The metal used to construct the metal electrode layers should be platinum, silver or some other metal that may withstand processing conditions of the piezoelectric material, which may be in the range of 500–700° C. in an oxidizing atmosphere.

The piezoelectric actuating element is affixed to a movable circuit contact, mounted upon a support structure such as a substrate or integrated chip. The movable circuit contact is deformable with respect to a fixed circuit contact mounted on another portion of the support structure. In a cantilever relay according to the present invention, the movable circuit contact has one fixed end and one movable nonfixed end, whereas in the bridge relay according to the present invention, the movable circuit contact has at least two fixed ends, with a movable central portion.

According to one aspect of the invention, when the piezoelectric actuating element is actuated, the movable circuit contact deforms to selectively engage one or more fixed contacts. According to an alternative embodiment, when the piezoelectric actuating element is actuated, the movable circuit contact deforms to disengage one or more fixed contacts. In either embodiment, when the movable circuit contact is mechanically and electrically coupled to the fixed circuit contact(s), the relay is in a conductive state. When the movable and fixed circuit contact(s) are separated by a gap, the relay is in a nonconductive state.

In order to provide electrical isolation between the metal electrode layers of the piezoelectric actuating element and the contacts, an insulating layer such as silicon oxide or silicon nitride is deposited between the metal electrode layers and the circuit contacts. The thickness of the insulating material will depend on the voltage of the circuit to be switched, as the insulating layer should provide electrical isolation between the piezoelectric actuating element and the circuit contacts.

In the cantilever relay, larger displacements with smaller device dimensions can be achieved but with lower force capability due to the free movement on the non-fixed end of the piezoelectric actuator. The bridge relay requires larger device dimensions and produces smaller displacements but generates higher piezoelectric forces than the cantilever design. The device dimensions of the relay may be between 100 micrometers to a few millimeters in length, although other dimensions may be achieved. Because the piezoelectric element is flexible, the cantilever or bridge will generally be in planar configuration over the fixed contact when the relay is in a nonconductive state. However, the cantilever and diaphragm may be designed to have a natural recoiled or non-planar configuration when the relay is in a nonconductive state. The strong actuation force of the piezoelectric actuating element allows for relatively thick metal electrode layers to be utilized for the circuit contacts, allowing the relay to carry large currents.

Due to its micromachined construction, piezoelectric relays according to the present invention can be integrated with the circuit to be switched, and electrical signals from the circuit contacts and metal electrode layers can be easily isolated to prevent arcing between them by providing a sufficient insulating layer between them. Relays according to the present invention also use less power and can be fabricated in large quantities more efficiently by wafer-scale processing compared with discrete bulk relay devices. Finally, relays according to the present invention are smaller and use less power than other relays, and provide a wide temperature range of operation due to the high Curie temperatures (as high as 300–400° C.) of the piezoelectric thin film material.

Other features and advantages of the present invention will become apparent to one skilled in the art upon examination of the following drawings and detailed description. It is intended that all such features and advantages be included herein within the scope of the present invention as defined by the appended claims.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

Figure 1:
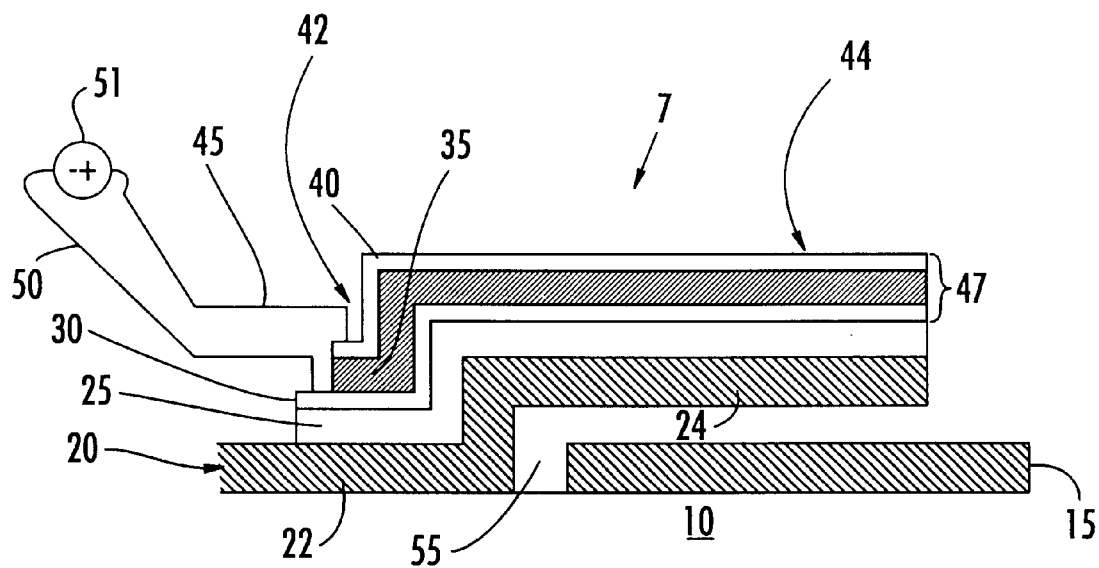
FIG. 1 is a cantilever relay in a nonconductive state in accordance with an embodiment of the present invention.

FIG. 1. shows a cantilever relay 7 in accordance with an embodiment of the present invention. The relay 7 includes a support structure 10, such as a substrate, a circuit board, an integrated chip, or any other structure containing an electrical circuit. Furthermore, the cantilever relay 7 may be integral to the circuit to be switched. A fixed first contact 15 and a movable second contact 20 are fabricated on the support structure 10, using well known photolithographic techniques. The fixed first contact 15, deposited by evaporation or sputtering, contains a thin metal adhesion layer such as chromium or titanium deposited on the support structure 10, followed by thick conducting metal deposition such as platinum, silver or gold. This layer is patterned via photolithography and etched, and a sacrificial layer such as silicon dioxide is then deposited on top of the fixed first contact 15 using evaporation or wet-chemical spin coating processes. Following patterning of the sacrificial layer, the movable second contact 20 is deposited using similar materials and processes as the fixed contact, and then patterned and etched. The sacrificial layer may then be removed by chemical etching or may remain in place prior to deposition of the piezoelectric layer, discussed in detail below. The purpose of the sacrificial layer is to create a gap between the first fixed contact 15 and movable second contact 20.

In a preferred embodiment, the fixed first contact 15 preferably comprises a conductive metal with sufficient thickness to withstand substantial current, for example, in excess of 1 amp, and excessive ablation due to any friction or rubbing of the fixed first contact 15 against other materials of the relay 7, specifically, the movable second contact 20. Examples of metals that may be used to make fixed first contact 15 include copper, silver, platinum, gold, titanium or chromium, or any combination thereof. However, it will be appreciated by those skilled in the art that other conductive metals may be employed.

The movable second contact 20 is affixed to the support structure 10 by a base 22 proximate to the fixed contact 15. The movable second contact 20 can be constructed from any suitable material, such as those that may be used to construct the fixed first contact 15, including the same material. The movable second contact 20 includes a projection 24 located opposite the fixed first contact 15 so that the fixed first contact 15 resides between at least a portion of the projection 24 and the support structure 10. In the embodiment of FIG. 1, the movable second contact 20 is shown to be separated from the fixed first contact 15 by a gap 55 which may be comprised substantially of nonconductive substances such as air, gases, or fluids.

An insulating layer 25 is disposed upon the surface of movable second contact 20 opposite the support structure 10. Insulating layer 25 may be a conformal layer, and may be deposited upon movable second contact 20 so that it extends along the entire length or a partial length of movable second contact 20. In a preferred embodiment, the insulating layer 25 is silicon oxide or silicon nitride. However, it will be appreciated by those of skill in the art that any suitable insulating material may be used for insulating layer 25.

As is shown in FIG. 1, a piezoelectric actuating element 47 is disposed on the insulating layer 25 opposite the movable second contact 20. The piezoelectric actuating element 47 comprises a piezoelectric material 35 sandwiched in between a first metal electrode layer 30 and a second metal electrode layer 40. The piezoelectric material 35 may comprise a film, such as a thin film ceramic or polymer, comprising a piezoelectric or electrostrictive composition, such as lead zirconate titanate (PZT), barium titanate, lead magnesium niobate, lead titanate, polyvinylidene fluoride (PVF2), PLZT (a PZT material with lanthanum doping or admixture), or another suitable piezoelectric material known to those of skill in the art. The thickness of the piezoelectric material 35 is preferably in the range of 1 to 10 µm, although other thicknesses may be utilized. One function of the insulating layer 25 is to provide electrical isolation between the movable second contact 20 and the piezoelectric actuating element 47. To perform this function, it should be appreciated that insulating layer 25 should be of a suitable thickness so that there is no influence of the circuit electric field on the piezoelectric actuating element 47 and vice versa.

The piezoelectric actuating element 47 may be formed in steps, wherein first metal electrode layer 30 is deposited upon the insulating layer 25 using metals and processes suitable for the contact layers, followed by the deposition of piezoelectric material 35 on the first metal electrode layer 30, and followed by the deposition of the second metal electrode layer 40 on the piezoelectric material 35. Thin film piezoelectric ceramic materials such as PZT, barium titanate, lead magnesium niobate, lead titanate, polyvinylidene fluoride (PVF2), PLZT (a PZT material with lanthanum doping or admixture), may be deposited by a number of well-known processes including sol-gel deposition, sputtering, chemical vapor deposition (CVD), laser ablation and the like. Following deposition, the material can be heat treated (or alternatively heat treated in situ) to temperatures in the range of 500–700° C. in oxidizing atmospheres to achieve the desired perovskite crystalline structure and sufficient piezoelectric properties. Deleterious effects from relatively high heat treatment temperatures can be minimized by using very short anneals using processes such as rapid thermal annealing. In the case of piezoelectric polymers, the materials are generally formed by chemical methods, for example spin coating, and the heat treatment parameters are less severe (i.e., lower temperatures).

The first metal electrode layer 30 and the second metal electrode layer 40 are preferably made of platinum, although additional metals able to withstand piezoelectric ceramic processing temperatures can also be used. The metal electrode layers 30, 40 should also be of sufficient thickness to withstand such processing. Additionally, if the piezoelectric relay is deposited directly onto the circuit to be switched, the circuit elements should be selected to withstand thin film piezoelectric ceramic processing temperatures. In the case of piezoelectric polymers, materials and elements with lower temperature capability may be used.

In the cantilever relay of FIG. 1, the piezoelectric actuating element 47 includes a distal end 44 located opposite the projection 24, and a proximate end 42, located opposite the base 22. A negative terminal 50 of a power source 51 can be in electrical communication with a portion of the first metal electrode layer 30 at the proximate end 42 of the piezoelectric actuating element 47. A positive terminal 45 of the power source 51 is in electrical communication with a portion of the second metal electrode layer 40 at the proximate end 42 of the piezoelectric actuating element 47. In a preferred embodiment, the positive terminal 45 and negative terminal 50 are the positive and negative terminals of a single power source 51, although multiple power sources can also be utilized.

Figure 2:
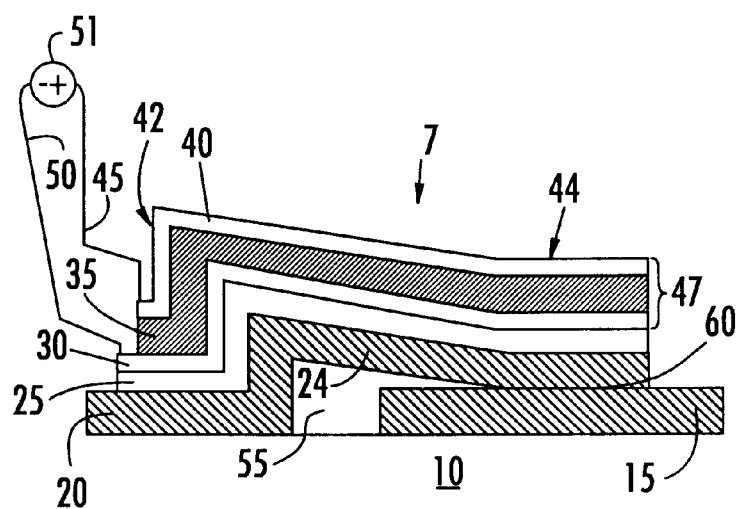
FIG. 2 is the cantilever relay of FIG. 1 in a conductive state in accordance with an embodiment of the present invention.

An electric field generated by a power source, cycled from positive to negative, applied to the piezoelectric actuating element 47 at the proximate end 42 provides a pull mechanism to cause the relay 7 to enter a nonconductive state, as illustrated in FIG. 1. The voltage differential across the piezoelectric material 35 may be between 5V and 50V, depending on the piezoelectric thickness. The electric field also provides a push mechanism to cause the relay 7 to enter a conductive state, as shown in FIG. 2. The relay 7 is in a nonconductive state when gap 55 exists between the entire surface of the projection 24 of the movable second contact 20 and the entire surface of the fixed first contact 15 closest to movable second contact 20. In the nonconductive state the movable second contact 20 is electrically isolated from fixed first contact 15. The relay 7 is in a conductive state, as shown in FIG. 2, when gap 55 does not exist in between the projection 24 of the movable second contact 20 and fixed first contact 15. In this state, movable second contact 20 is deformed to engage the fixed first contact 15 whereby the contacts are physically and electrically connected along a common surface 60.

According to one aspect of the invention, the cantilever relay 7 may be formed such that movable second contact 20 is in contact with fixed first contact 15, as is shown in FIG. 2, when no voltage is being applied across the actuating element 47. In this embodiment, the relay 7 functions the same as in the previous embodiment. However, the relay state (i.e., conductive or nonconductive) is opposite the relay state of the previous embodiment when power is supplied, or is not supplied, to the actuating element 47. Therefore, application of voltage to the actuating element 47 may cause the relay to enter a non-conductive state.

One skilled in the art will appreciate that the minimum desired thickness of the piezoelectric actuating element 47 can depend upon the voltage of the circuit to be switched. A thicker piezoelectric material will result in a larger piezoelectric response to move thicker metal contacts, but larger electric fields may be required for operation.

Figure 3:
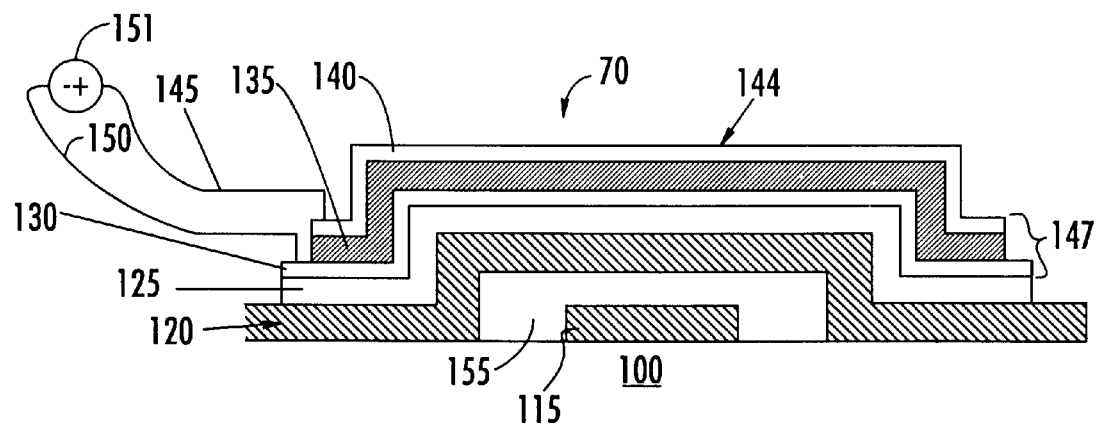
FIG. 3 is a bridge relay in a nonconductive state in accordance with another embodiment of the present invention.

FIG. 3 shows a bridge relay 70 in a nonconductive state in accordance with another embodiment of the present invention. The bridge relay 70 can be constructed in a similar manner as the cantilever relay 7, and can include substantially the same layers as relay 7. It will be appreciated by those of skill in the art that embodiments disclosed with respect to the cantilever relay 7, may also be implemented in the bridge relay 70. Thus, like elements and structures may include like materials and constructions.

The bridge relay 70 differs from the cantilever relay 7 in that the piezoelectric actuating element 147, insulating layer 125, and movable second contact 120 include at least two fixed ends, a first end and a second end, each affixed to a first and second position, respectively, of the support structure 100. As with the cantilever relay, the bridge relay 70 may be integral to the support structure, which may be a circuit to be switched. The relay 70 also includes a fixed first contact 115 which is mounted upon the support structure 100. The relay 70 includes a deformable central portion 144 located substantially between the first and second ends of the movable second contact 120, which is deformable with respect to a fixed first contact 115. In the conductive state, shown in FIG. 4, the movable second contact 120 engages the fixed first contact 115 so that the fixed first contact 115 and movable second contact 120 are physically and electrically connected along a common surface 160. In the nonconductive state of FIG. 3, the fixed first contact 115 and movable second contact 120 are separated by a gap 155. As with the cantilever relay 7, described above, the gap 155 may be comprised substantially of non-conductive substances such as air, gases, or fluids.

Like the cantilever relay 7, the bridge relay 70 includes a fixed first contact 115 affixed to a portion of the support structure, and a movable second contact 120, affixed to a second portion of the support structure 100. The bridge relay 70 also includes an insulating layer 125 affixed to the movable second contact 120 opposite the support structure 100 and fixed first contact 115. The piezoelectric actuating element 147 is affixed to the insulating layer 125, and includes a piezoelectric material 135 sandwiched in between the first metal electrode layer 130 and a second electrode metal layer 140. The piezoelectric actuating element 147 is coupled to the second contact 120, wherein the piezoelectric actuating element 147 can deform the movable second contact 120. It will be appreciated by those of skill in the art that materials and embodiments disclosed above for the fixed first contact 15, movable second contact 20, support structure 10, insulating layer 25, piezoelectric material 35 and the metal electrode layers 30, 40 may be used for like components in bridge relay 70.

Figure 4:
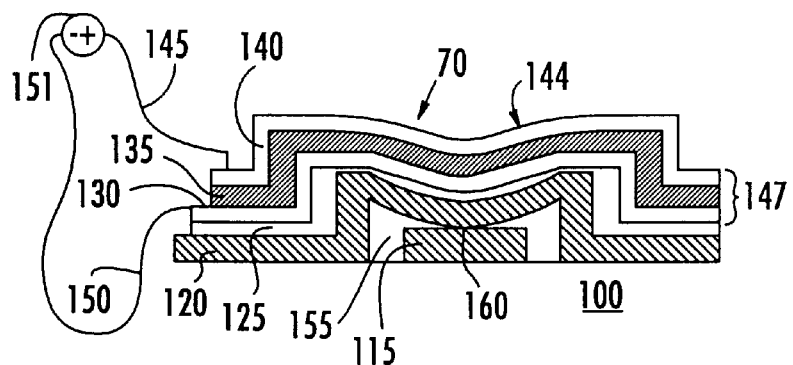
FIG. 4 is the bridge relay of FIG. 3 in a conductive state in accordance with another embodiment of the present invention.

The first metal electrode layer 130 can be connected to a negative terminal 150 of a power source 151, and second metal electrode layer 140 is connected to a positive terminal 145 of a power source 151. In a preferred embodiment, the positive terminal 145 and negative terminal 150 are the positive and negative terminals of a single power source, although multiple power sources may also be utilized. As in relay 7, an electric field generated by the power source 151, cycled from positive to negative, applied to the piezoelectric actuating element 147 through metal electrode layers 130 and 140 provides a pull mechanism to cause the relay 70 to enter a nonconductive state, as illustrated in FIG. 3. The electric field also provides a push mechanism to cause the relay 70 to enter a conductive state, as shown in FIG. 4. As in the cantilever relay embodiment, above, this power source may produce a voltage differential in the range of 5V to 50V.

According to one aspect of the invention, the bridge relay 70 may be formed such that movable second contact 120 is in contact with fixed first contact 115, as is shown in FIG. 4, when no voltage is being applied across the actuating element 147. In this embodiment, the relay 70 functions the same as in the previous embodiment. However, the relay state (i.e., conductive or nonconductive) is opposite the relay state of the previous embodiment when power is supplied, or is not supplied, to the actuating element 147. Therefore, application of voltage to the actuating element 147 may cause the relay to enter a non-conductive state.

Comparatively, the cantilever relay 7 may achieve a larger displacement between the fixed first contact 15 and the movable second contact 20 than can be achieved between the fixed first contact 115 and the movable second contact 120 of the bridge relay 70, due to the free movement of the nonfixed end of the movable second contact 20 and the piezoelectric actuating element 47. Furthermore, because the cantilever relay 7 requires less structure than the bridge relay 70, the cantilever relay 7 may be constructed smaller than a bridge relay 70.

On the other hand, the bridge relay 70 provides some advantages over the cantilever relay 7. Higher actuation forces may be achieved with the bridge relay 70 than in the cantilever relay 7 because larger device dimensions (e.g., more piezoelectric material) and more structural supports are included. This is due to the support of the piezoelectric actuating element 147, insulating layer 125 and movable second contact 120 on two portions of the support structure 100, as compared to only one portion in the cantilever relay 7.

Due to the micromachined structure and small amount of piezoelectric material used, the device dimensions of the cantilever and bridge embodiments may be between 100 $\mu$m to a few mm in length, although other dimensions may be achieved. The relays 7 and 70 may be fabricated by low cost chemical processing methods such as sol-gel deposition. Furthermore, large-area blanket films may be deposited, patterned and etched to form arrays of switches for manipulation of complex circuits. The construction of the relays 7 and 70 results in a strong actuation force of the piezoelectric actuating element 47, 147, which allows for thick metal contacts, allowing the relay to carry large currents, in the range of 1 ampere.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A microelectronic relay comprising:
   a support structure;
   a first contact coupled to the support structure;
   a second contact coupled to the support structure at a plurality of positions and having a deformable portion substantially opposite the first contact for selectively engaging the first contact, and
   a piezoelectric actuator coupled to the second contact, wherein the piezoelectric actuator selectively deforms the second contact relative to the first contact.

2. The microelectronic relay of claim 1, wherein the second contact comprises:
   a first end coupled to the support structure at a first position;
   a second end coupled to the support structure at a second position, and
   a central portion substantially between said first end to said second end.

3. The microelectronic relay of claim 1, further comprising an insulating layer disposed on the second contact.

4. The microelectronic relay of claim 1, wherein the piezoelectric actuator comprises a piezoelectric film sandwiched between a first metal electrode layer and a second metal electrode layer.

5. The microelectronic relay of claim 2, wherein the central portion is deformable.

6. The microelectronic relay of claim 4, further comprising a power source electrically connected to the first metal electrode layer and the second metal electrode layer.

7. The microelectronic relay of claim 6, wherein the piezoelectric film is chosen from a group consisting of a ceramic thin film with a piezoelectric composition, a ceramic thin film with an electrostricive composition, a polymer thin film with a piezoelectric composition, and a polymer thin film with an electrostrictive composition.

* * * * *